(12) United States Patent
Heldrich et al.

(10) Patent No.: US 11,092,640 B2
(45) Date of Patent: Aug. 17, 2021

(54) METHOD FOR CHECKING THE PLAUSIBILITY OF MEASUREMENTS OF AN ACTUATOR CURRENT AND USE OF THE METHOD

(71) Applicant: VITESCO TECHNOLOGIES GERMANY GMBH, Hannover (DE)

(72) Inventors: Konrad Heldrich, Nuremberg (DE); David Crate, Nuremberg (DE)

(73) Assignee: Vitesco Technologies Germany GmbH, Hannover (DE)

( * ) Notice: Subject to any disclaimer, the term of this patent is extended or adjusted under 35 U.S.C. 154(b) by 0 days.

(21) Appl. No.: 16/761,890

(22) PCT Filed: Oct. 30, 2018

(86) PCT No.: PCT/EP2018/079731
§ 371 (c)(1),
(2) Date: May 6, 2020

(87) PCT Pub. No.: WO2019/086468
PCT Pub. Date: May 9, 2019

(65) Prior Publication Data
US 2021/0172998 A1 Jun. 10, 2021

(30) Foreign Application Priority Data
Nov. 6, 2017 (DE) .............................. 102017219633

(51) Int. Cl.
*G01R 19/165* (2006.01)
*G01R 31/28* (2006.01)
*G01R 35/00* (2006.01)
*G01R 19/00* (2006.01)

(52) U.S. Cl.
CPC ..... *G01R 31/2829* (2013.01); *G01R 19/0092* (2013.01); *G01R 35/00* (2013.01)

(58) Field of Classification Search
CPC . G01R 19/0092; G01R 35/00; G01R 31/2829
See application file for complete search history.

(56) References Cited

U.S. PATENT DOCUMENTS

| 6,242,938 B1 | 6/2001 | Kessler |
| 9,438,097 B2 | 9/2016 | Schwarzmann et al. |
| 2005/0002143 A1 | 1/2005 | Satoh et al. |

FOREIGN PATENT DOCUMENTS

| DE | 19640190 A1 | 9/1996 |
| DE | 19915593 A1 | 11/2000 |
| DE | 10242791 A1 | 3/2004 |
| DE | 102012203940 A1 | 9/2013 |
| DE | 102012215155 A1 | 2/2014 |

*Primary Examiner* — Alesa Allgood
(74) *Attorney, Agent, or Firm* — Laurence A. Greenberg; Werner H. Sterner; Ralph E. Locher

(57) ABSTRACT

A method checks the plausibility of a measurement of an actuator current by use of an actuator two-terminal network. The actuator two-terminal network contains an inductive load and a resistive load. A first pole of the actuator two-terminal network is connected to a supply voltage via a pulse-width-modulated switch and is connected to earth via a freewheeling diode arranged in the reverse direction, and wherein a second pole of the actuator two-terminal network is connected to earth.

19 Claims, 5 Drawing Sheets

METHOD FOR CHECKING THE PLAUSIBILITY OF MEASUREMENTS OF AN ACTUATOR CURRENT AND USE OF THE METHOD

BACKGROUND OF THE INVENTION

Field of the Invention

The invention relates to a method for checking the plausibility of measurements of a current that is used to control an electrohydraulic or electromechanical device, referred to below as an actuator. The invention relates in particular to a method for checking the plausibility of a current measurement in actuators in a motor vehicle, for instance electrically controlled valves or electro-hydraulically operated gear selectors in automatic transmissions.

Methods are known from the prior art in which actuators are controlled by a periodic control signal by means of pulse width modulation of an applied voltage, in which the duty cycle, as the ratio of the pulse width to the period, is varied. A measurement circuit detects an average current through the actuator, which average current is dependent on the duty cycle. Measurement circuits for detecting current, for instance by measuring the voltage across a shunt resistor of known purely Ohmic resistance, are known from the prior art.

In order to check the plausibility of the current measurement, in the method from the prior art, a predetermined duty cycle is set, and the resultant average actuator current is measured and compared with a reference value. If the measured current lies outside a tolerance band around the reference value, the current measurement is identified as implausible. Possible causes of an implausible current measurement may lie in ageing of components, short-circuits to ground or to the supply voltage, or in temperature-induced parameter variations.

SUMMARY OF THE INVENTION

The object of the invention is to define an improved method for checking the plausibility of a current measurement for actuators. The object of the invention is in particular to define a method for checking the plausibility of a current through an actuator comprising an inductive load, which method allows a plausibility check within a narrow tolerance band regardless of influencing parameters such as supply voltage, temperature or ageing, and regardless of the inductive load and/or resistive load of an actuator, and therefore also for actuators of different design.

The method described below for checking the plausibility of a current measurement of an actuator is used in particular in solenoid valves, in particular in a solenoid poppet valve, a fast-switching valve, an electromagnetic proportional valve, an electromagnetic on/off valve, an electromagnetic injector or a gear-selector valve.

Details and exemplary embodiments of the invention are described more closely below with reference to drawings.

DETAILED DESCRIPTION OF THE INVENTION

Corresponding parts and/or physical variables are denoted by the same reference signs in all the figures.

Figure 1:
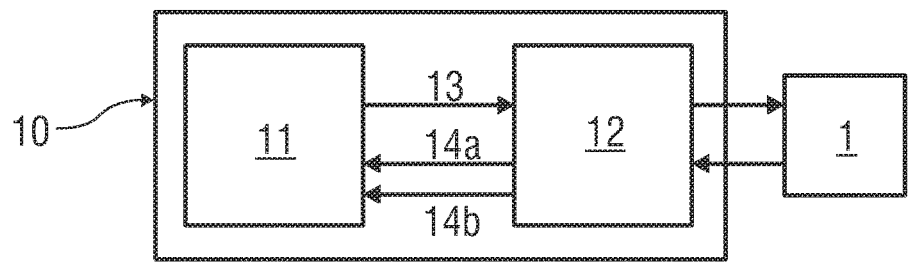
FIG. 1 shows schematically a control circuit for an actuator according to the prior art.

FIG. 1 shows schematically a control device 10 for an actuator 1, which control device is known from the prior art. The control device 10 comprises a microcontroller 11 and a driver and measurement circuit 12. The microcontroller 11 generates a pulse width modulated control signal 13 for controlling the actuator 1. The control device 10 supplies the actuator 1 with a current that is proportional to a duty cycle $T_V$ of the pulse width modulated control signal 13. The current through the actuator 1 is detected twice by the driver and measurement circuit 12, which detected currents differ from one another in that the current measurement signal 14a includes the current via the freewheeling diode 2 during the open time length $t_{off}$ of the switch 3, and the current measurement signal 14b does not include the current via the freewheeling diode 2 during the open time length $t_{off}$ of the switch 3. The driver and measurement circuit 12 transfers the current measurement signal 14a and the current measurement signal 14b to the microcontroller 11. The microcontroller 11 calculates from the current measurement signals 14a, 14b, each measured at three different duty cycles $T_V$, the curve of both current measurement signals at Tv=0 and Tv=1. An implausible current measurement is identified if the calculated values at Tv=0 or Tv=1 differ too widely from each other.

Figure 2:
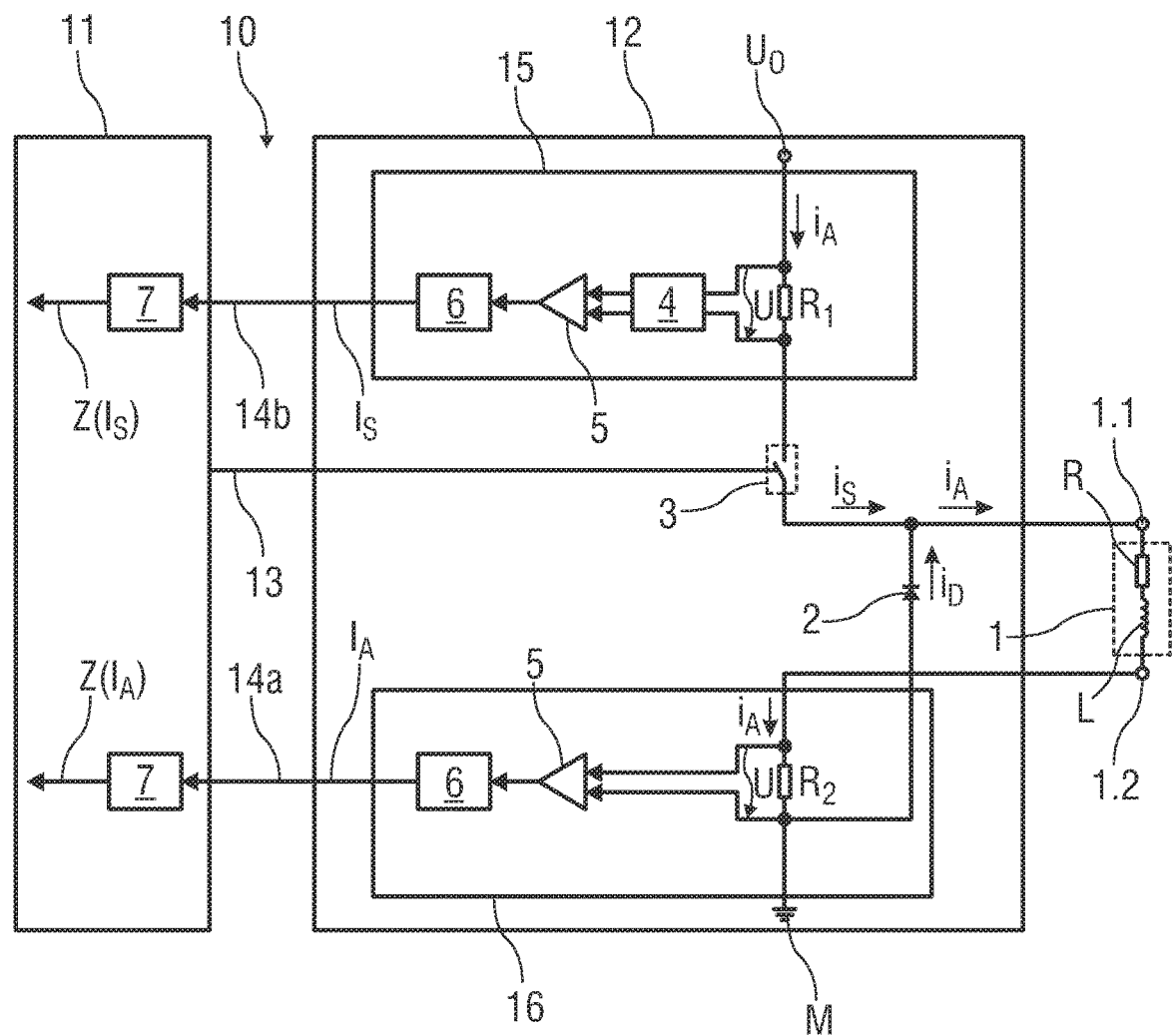
FIG. 2 shows schematically a control device for controlling an actuator.

FIG. 2 shows parts of the control device 10 in detail. The pulse width modulated control signal 13 generated by the microcontroller 11 controls a switch 3 of the driver and measurement circuit 12, wherein the switch 3 is closed for the pulse length $t_{on}$ of the pulse width modulated control signal 13, and a first terminal 1.1 of the actuator 1 in the form of a two-terminal actuator 1 is connected via a first shunt resistor $R_1$ to the supply voltage $U_0$. The first terminal 1.1 is also connected to ground M via a freewheeling diode 2 connected in reverse-bias.

The second terminal 1.2 of the two-terminal actuator 1 is connected to ground M via a second shunt resistor $R_2$.

The current flowing through the closed switch 3 flows through the resistor R1 (summation current $i_S$), through the actuator 1 and through the shunt resistor R2 (actuator current $i_A$). At this point in time there is no current flowing through the reverse-biased freewheeling diode 2 (diode current $i_D$=0). With switch 3 open, no current flows via the shunt resistor R1 ($i_S$=0). If the actuator 1 comprises an inductive load L then the current continues to flow in the same direction via the shunt resistor $R_2$ ($i_A$) and the freewheeling diode 2 ($i_D$), which is now forward-biased.

The time-averaged value $I_s$ of the summation current is $i_S$ detected by a first measurement chain 15, wherein the voltage drop u across the first shunt resistor $R_1$ is measured, input to a smoothing low-pass filter 4, then amplified by an amplifier 5 and input to a noise suppression filter 6 such as a low-pass filter, anti-aliasing low-pass filter or averaging low-pass filter. From the output of the anti-aliasing low-pass filter or averaging low-pass filter 6, the current measurement signal 14b formed in this manner and containing the average summation current $I_s$ is input to an analog-to-digital converter 7 in the microcontroller 11, where it is discretized into a digital value $Z(I_s)$ and evaluated as described below in greater detail.

The time-averaged value $I_A$ of the actuator current $i_A$ is detected by a second measurement chain 16, wherein the voltage drop U across the second shunt resistor $R_2$ is measured, input to an amplifier 5 and band-limited and averaged in an anti-aliasing filter or averaging low-pass filter 6. From the output of the anti-aliasing low-pass filter or averaging low-pass filter 6, the current measurement signal 14a formed in this manner and containing the average actuator current $I_A$ is input to an analog-to-digital converter 7 in the microcontroller 11, where it is discretized into a digital value $Z(I_A)$ and evaluated as described below in greater detail.

Figure 3:
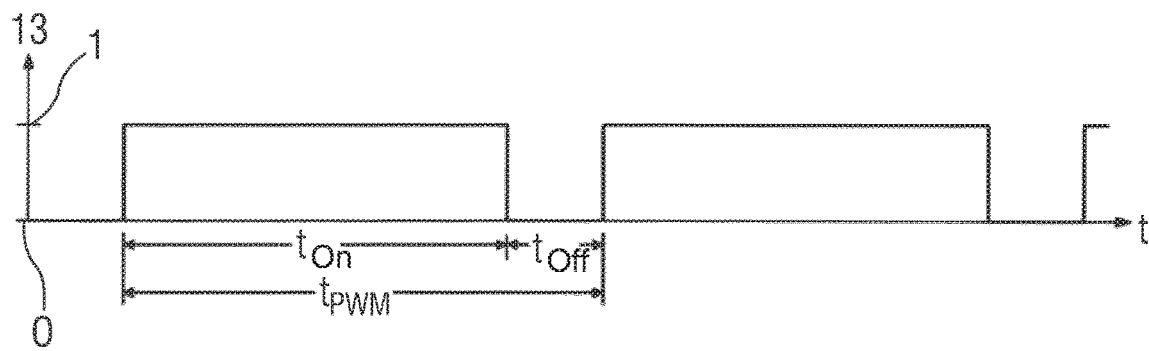
FIG. 3 shows schematically the temporal waveform of a summation current and of an actuator current during pulse width modulated control of the FIGS. 4A, 4B show schematically the curve of the average actuator current and of the average summation current as a function of the duty cycle of the pulse width modulated control for two different ratios $t_{PWM}$ to Tau.
Figure 3:
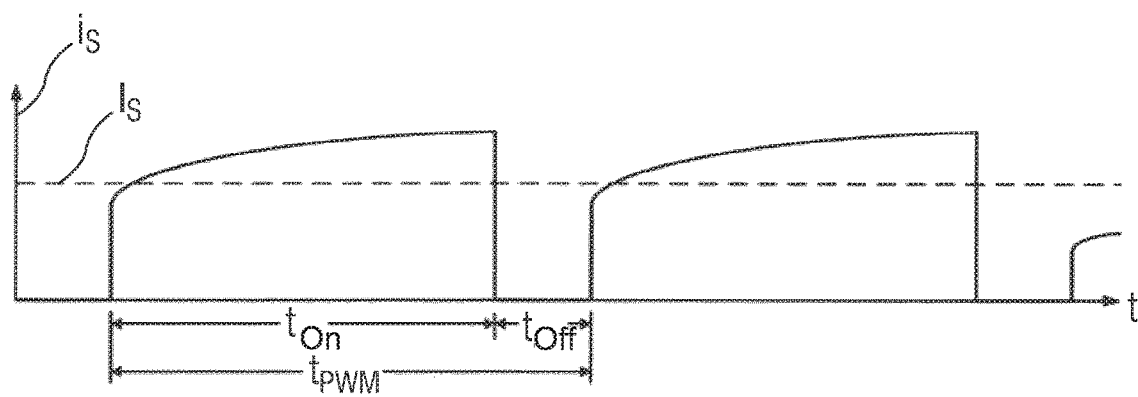
Figure 3:
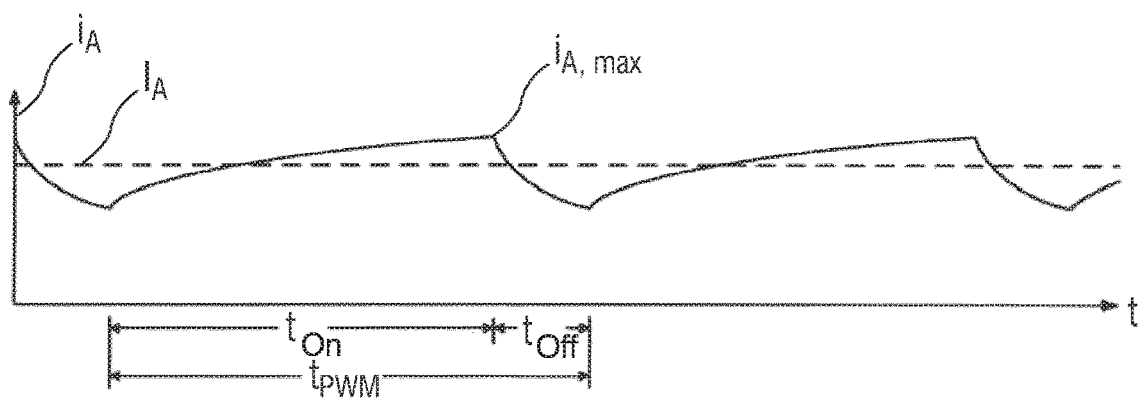

FIG. 3 shows schematically the time waveform of the summation current $i_S$ and of the actuator current $i_A$ as a function of the switching state of the switch 3 in the steady state for a duty cycle $T_V$ of the pulse width modulated control signal 13 of 80% $T_V$=0.8 by way of example. In the figure, the value 1 of the control signal 13 corresponds to a closed switch 3 having an ON duration $t_{on}$, and the value 0 of the control signal 13 corresponds to an open switch 3 of OFF duration $t_{off}$ and a resultant period $t_{PWMN}$.

If the switch 3 is closed during the pulse length $t_{on}$ of the control signal 13, then the same current $i_S$=$i_A$ flows through both shunt resistors $R_1$, $R_2$ because the freewheeling diode 2 is reverse biased and hence the diode current to $i_D$=0 is zero.

With the switch 3 open, i.e. between the pulses of the control signal 13, no current ($i_S$=0) flows through the first shunt resistor $R_1$ from the instant at which the switch 3 is opened. If the actuator 1 comprises an inductive load L, then in contrast, the actuator current $i_A$ decays only gradually, namely decays exponentially in accordance with the law of induction at a time constant $$\tau = \frac{L}{R_2 + R},$$

where R>>$R_2$ is the resistive load R in the actuator 1. The decaying actuator current $i_A$ is produced solely by the diode current, which flows through the freewheeling diode 2 in the forward direction when the switch 3 is open.

The time-averaged value $I_A$ of the actuator current therefore differs from the time-averaged value $I_S$ of the summation current precisely by the time-averaged value $I_D$ of the diode current, which is determined by the time constant τ of the exponential decay of the actuator current $i_A$, the open time length $t_{off}$ of the switch 3 and the maximum value $i_{A,max}$ of the actuator current $i_A$ at the end of the ON time length $t_{on}$ of the switch 3. The maximum value $i_{A,max}$ of the actuator current in turn depends on the ON duration or pulse length $t_{on}$ of the switch 3 and on a time constant $$\tau = \frac{L}{R_1 + R_2 + R}$$

that incorporates the entire resistive load $R_1$+$R_2$+R that is effective when the switch 3 is on, and the inductive load L of the actuator 1. It can be assumed here as an approximation, since R>>$R_1$, R ... $R_2$, that $R_1$+$R_2$+R≈R.

Figure 4A:
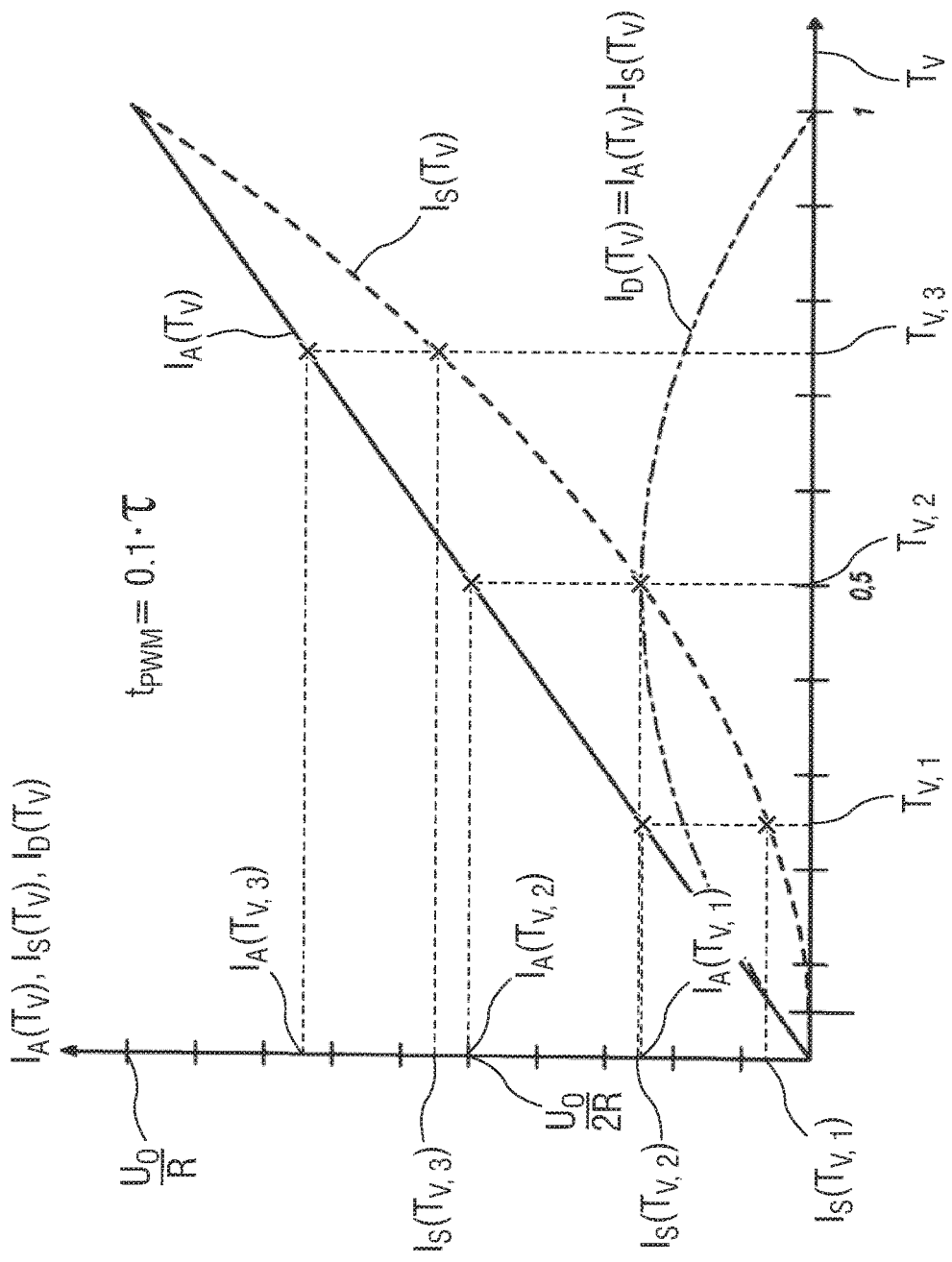
Figure 4B:
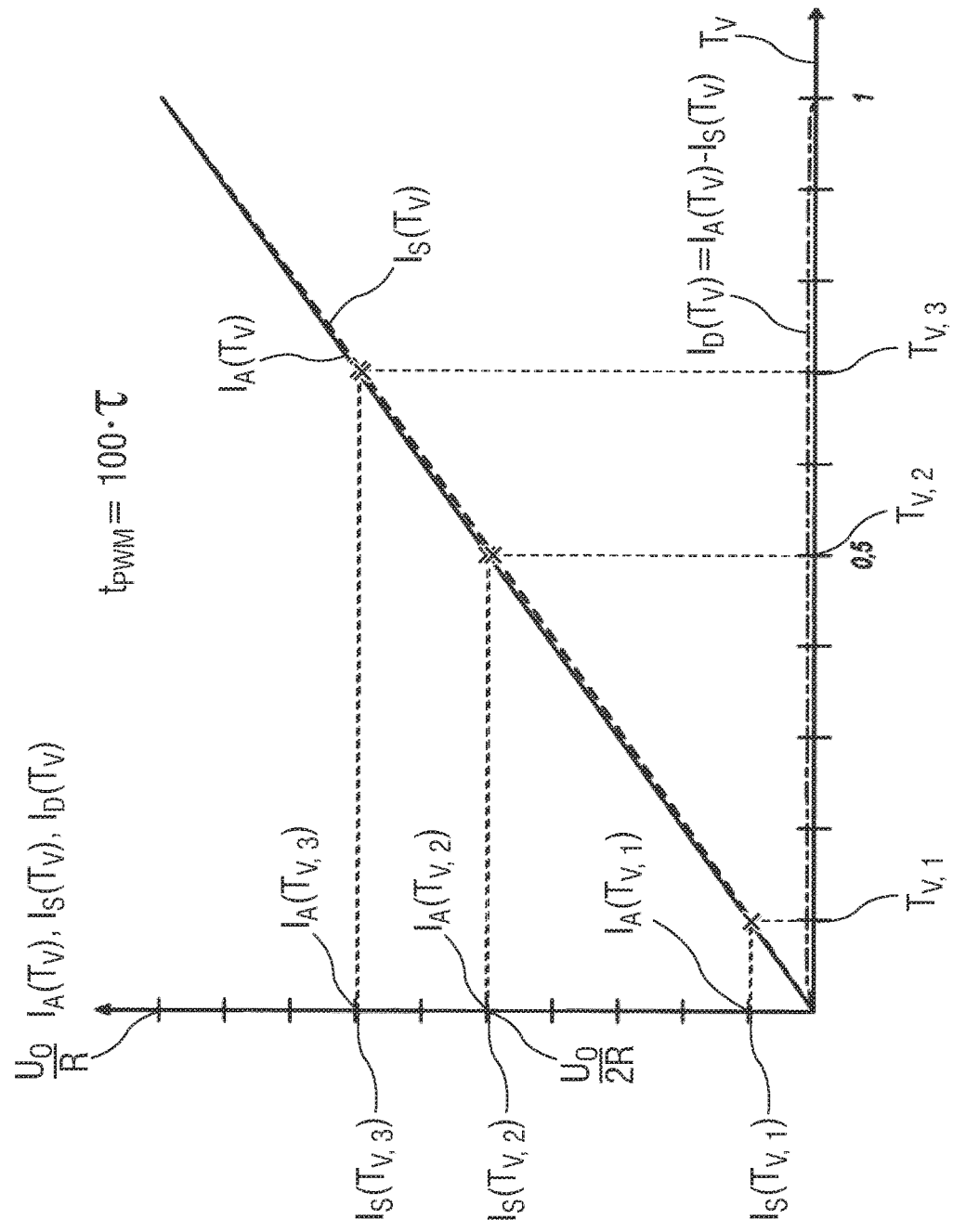

As shown in FIGS. 4A, 4B, it is hence possible to determine for each duty cycle $$T_v = \frac{t_{on}}{c_{off} + c_{on}} = \frac{t_{on}}{t_{PWM}}$$

of a periodic pulse width modulated control signal 13 of period length $T_{PWM}$=$t_{on}$+$t_{off}$, in the steady state, an associated average actuator current $I_A(T_V)$ and an associated average summation current $I_S(T_V)$. FIG. 4A shows schematically the curve of the average currents for a period length $t_{PWM}$ equal to one tenth of the time constant τ. FIG. 4B shows schematically the curve of the average currents for a period length $t_{PWM}$ equal to one hundred times the time constant τ.

The average actuator current $I_A(T_V)$ is proportional to the ON duration $t_{on}$ and hence lies on a straight line defined by the points $I_A(T_V$=0) and $$I_A(T_V = 1) = \frac{U_o}{R_1 + R_2 + R}.$$

The average summation current $I_S(T_V)$ runs below this straight line, with the difference between average actuator current and average summation current $I_A(T_V)$−$I_S(T_V)$ precisely equal to the average diode current $I_D(T_V)$, which is likewise dependent on the duty cycle $T_V$. Since with switch 3 permanently open (when $T_V$=0) and likewise with switch 3 permanently closed (when $T_V$=1) the diode current is zero or negligibly small, then given a correct or plausible current measurement, the curves of the average actuator current $I_A(T_V)$ and of the average summation $I_S(T_V)$ current must meet, or lie very close to each other, for the duty cycles $T_V$=0 and $T_V$=1. According to the invention, the actual curves of the average currents $I_A(T_V)$,$I_S(T_V)$, which curves depend on the resistive load R (comprising the resistances $R_1$, $R_2$, $R_A$) and on the inductive load L and are thus unknown, are modeled by respective polynomials $\hat{I}_A(T_V; T_{V,1}, T_{V,2}, \ldots T_{V,N})$, $\hat{I}_S(T_V; T_{V,1}, T_{V,2}, \ldots T_{V,N})$. For this purpose, the average actuator currents $I_A(T_{V,i})$ and the average summation currents $I_S(T_{V,i})$ are each measured for N duty cycles $T_{V,i}$; i=1.2 ... N selected as sample points.

The coefficients $a_{A,0}, a_{A,1}, \ldots a_{A,N-1}$ of the actuator current polynomial $\hat{I}_A(T_V; T_{V,1}, T_{V,2}, \ldots T_{V,N})$ are selected such that the actuator current polynomial at the sample points assumes the measured actuator currents: $\hat{I}_A(T_V$=$T_{V,i}; T_{V,1}, T_{V,2}, \ldots T_{V,N})$=$I_A(T_{V,i})$.

Similarly, the coefficients $a_{S,0}, a_{s,1}, \ldots a_{S,N-1}$ of the summated current polynomial $\hat{I}_S(T_V; T_{V,1}, T_{V,2}, \ldots T_{V,N})$ are selected such that the summated current polynomial at the sample points assumes the measured summation currents: $\hat{I}_S(T_{V,i}$=$T_V; T_{V,1}, T_{V,2}, \ldots T_{V,N})$=$I_S(T_{V,i})$.

Methods for efficiently determining polynomial coefficients $a_{A,0}, a_{A,1}, \ldots a_{A,N-1}, a_{S,0}, a_{s,1}, \ldots a_{S,N-1}$, are known from the prior art. For example, the polynomials, $\hat{I}_A(T_V; T_{V,1}, T_{V,2} \ldots T_{V,N})$, $\hat{I}_S(T_V; T_{V,1}, T_{V,2}, \ldots T_{V,N})$ can be written as Newton polynomials, the coefficients of which can be obtained in accordance with the method of divided differences. For example for N=3 sample points, this results in second-order polynomials of the form $$\hat{I}_A(T_V;T_{V,1},T_{V,2},\ldots T_{V,N}) = \alpha_{A,0} + \alpha_{A,1} \cdot (T_V - T_{V,1}) + \alpha_{A,2} \cdot (T_V - T_{V,1})(T_V - T_{V,2})$$

$$\hat{I}_S(T_V;T_{V,1},T_{V,2},\ldots T_{V,N}) = \alpha_{S,0} + \alpha_{S,1} \cdot (T_V - T_{V,1}) + \alpha_{S,2} \cdot (T_V - T_{V,1})(T_V - T_{V,2})$$

where the respective average current values $I_A(T_{V,i}), I_S(T_{V,i})$ at the sample points $T_{V,1}$, $T_{V,2}$, $T_{V,3}$ are used in the calculation of the polynomial coefficients.

The exponential decline in the actuator current $i_A$ when the switch 3 is off depends on the absolute OFF duration $t_{off}$, as is evident from FIG. 3. Thus an average summated current $I_S(T_V)$ also varies if the period $t_{PWM}$ is varied for a constant duty cycle $T_V$.

It is also significant that, given a constant period $t_{PWM,N}$, variation in the actuator 1 results in the same current curves (approximating the summated current $I_s$), provided the electrical parameters of the actuator 1 are compatible with the dimensioning of the driver/measurement circuit 12. In other words, the plausibility-checking method, given a constant PWM frequency, is suitable for different actuators 1 as long as these actuators are suitable for the driver/measurement circuit 12 that is present.

The ratio $t_{PWM,N}/\tau$ of period $t_{PWM,N}$ to time constant $\tau$ is key to a suitably dimensioned circuit/actuator combination. In an optimally dimensioned actuator circuit, the ratio $t_{PWM,N}/\tau$ is:

1.) <1; this results in an approximately parabolic curve for the average summated current Is (shown in FIG. 4A). In practice, this corresponds to operation with an inductive actuator.

or

2.) >50 or better >100; this results in an approximately linear curve for the average summated current Is (shown in FIG. 4B). In practice, this corresponds to operation with a resistive actuator.

For both ratios, the plausibility can advantageously be determined with small tolerances. Ratios between the two aforementioned ratios, i.e. ratios in the range of $1 < t_{PWM}/\tau < 50$ represent a rather unsatisfactorily dimensioned circuit/actuator combination, which in practice can result in valve seat bounce, for instance, which is to be avoided. If the plausibility-checking method is used in such a circuit/actuator combination, it leads to some degree of deviation itself, which in turn must be compensated by widening the tolerances, thereby removing an advantage of the plausibility-checking method (narrow tolerances).

As shown schematically in FIGS. 4A/4B, the curve of the average summation current $I_S(T_V)$ over the entire range of duty cycles approximates a parabolic/linear curve when the ratio $t_{PWM}/\tau$ tends towards zero/infinity. Such curves can be approximated particularly well by a second-order polynomial $\hat{I}_S(T_V; T_{V,1}, T_{V,2}, T_{V,3})$, which can be uniquely determined by means of N=3 duty cycles $T_{V,1}, T_{V,2}, T_{V,3}$ acting as sample points. It is not essential for the sample points to be equally distributed. Often it is not possible in practice to "pick" sample points that are equally distributed over the entire range $0 \leq Tv \leq 1$. The condition here is that they must differ within pairs (Tv1≠Tv2, Tv1≠Tv3, Tv2≠Tv3).

Figure 5:
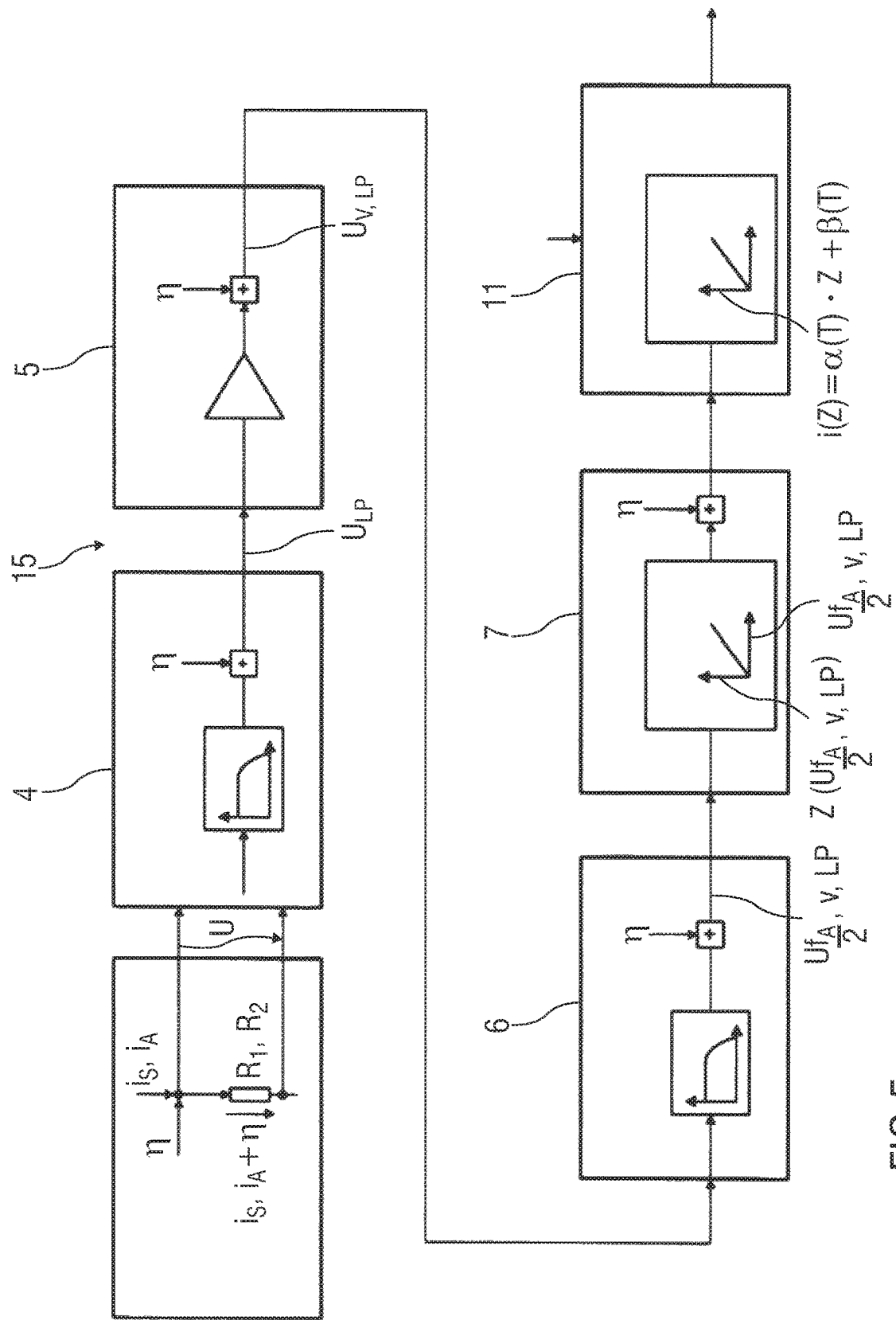
FIG. 5 shows schematically an arrangement for determining a measured current value.

FIG. 5 shows by way of example a schematic arrangement for measuring an average current through a shunt resistor $R_1, R_2$ by means of a measuring chain 15. The shunt resistor $R_1, R_2$ can be arranged, as the first shunt resistor $R_1$, in the path of the summation current is between the supply voltage $U_0$ and the switch 3. The shunt resistor may also be arranged, as the second shunt resistor $R_2$, in the path of the actuator current $i_A$ between the second terminal 1.2 of the two-terminal actuator 1 and ground M. The measurement chain 15 comprises an amplifier 5, an anti-aliasing low-pass filter/averaging low-pass filter 6 and, on the output side, an analog-to-digital converter 7. The measurement chain 15 optionally comprises a smoothing low-pass filter 4 on the input side.

Current flow causes a voltage drop u across the shunt resistor $R_1, R_2$. The voltage drop u is optionally input to a smoothing low-pass filter 4 and smoothed by this filter. The smoothed output voltage $u_{LP}$ at the output of the smoothing low-pass filter 4 is input to an amplifier 5. If the smoothing low-pass filter 4 is omitted, the voltage drop u is input directly to the amplifier 5. In the summation current measurement, the smoothing low-pass filter 4 is primarily used for noise suppression and for filtering out high frequency components in the signal, in particular steep switch-on/switch-off edges.

The smoothing low-pass filter 4 can be omitted in the actuator current measurement because the inductive actuator 1 itself "acts" as an RL low-pass filter.

The smoothed and amplified output voltage $U_{v,LP}$ at the output of the amplifier 5 is input to an anti-aliasing low-pass filter/averaging low-pass filter 6. The upper cutoff frequency $f_g$ of the anti-aliasing low-pass filter/averaging low-pass filter 6 is selected in accordance with the sampling theorem to be less than half the sampling frequency $f_a$ of a downstream analog-to-digital converter 7

$$f_g < \frac{1}{2} f_A.$$

The analog-to-digital converter 7 converts the smoothed, amplified and band-limited output voltage $$u \frac{f_A}{2}, v, LP$$

of the anti-aliasing low-pass filter/averaging low-pass filter 6 according to a predetermined transformation or characteristic into a digital value Z, which can be represented as a bit pattern and which can be interpreted by the microcontroller 11 as a signed integer or a floating-point value, for example.

In the Microcontroller 11, this digital value Z is converted into a current value by applying a linear function $i(Z) = \alpha(T) \cdot Z + \beta(T)$, where the gradient $\alpha(T)$, and the current $\beta(T)$ associated with a numerical value Z=0, are defined according to the temperature T of the shunt resistor $R_1, R_2$.

It is known from the prior art that additive interference can be superimposed on the output of a smoothing low-pass 17 filter 4 and/or the output of an amplifier 5 and/or the output of an anti-aliasing low-pass filter 6 and/or the output of an analog-to-digital converter 7, which interference may be constant over time in the form of an offset, or may vary over time in the form of drift or noise.

The introduction of interference η into the measurement chain 15 and hence into the calculation of the current value $i(Z)$ results in a difference in a measured value for an average current $I_S(T_{V,i}), I_A(T_{V,i})$ measured at any duty cycle $T_{V,i}$ and hence results in sample points for at least one polynomial $\hat{I}_S(T_V; T_{V,1}, T_{V,2}, \ldots T_{V,N}), \hat{I}_A(T_V; T_{V,1}, T_{V,2}, \ldots T_{V,N})$ which is chosen to pass exactly through the sample points, that differ with respect to an interference-free measurement chain 15. Thus the polynomials $\hat{I}_S(T_V; T_{V,1}, T_{V,2}, \ldots T_{V,N})$, $\hat{I}_A(T_V; T_{V,1}, T_{V,2}, \ldots T_{V,N})$ do not meet at at least one of the two boundary points $T_V=0, T_V=1$, at variance with the theoretically expected relationship. Interference along the measurement chain 15 can thereby be identified advantageously by means of the plausibility-checking method according to the invention.

LIST OF REFERENCE SIGNS 1 two-terminal actuator, actuator
1.1 first terminal
1.2 second terminal
2 freewheeling diode
3 switch
4 smoothing low-pass filter
5 amplifier
6 anti-aliasing low-pass filter
7 analog-to-digital converter
10 control device
11 microcontroller
12 driver and measurement circuit
13 control signal
14a current measurement signal
14b redundant current measurement signal
15, 16 first, second measurement chain
M ground
$f_g$ cutoff frequency
η additive interference
$U_0$ supply voltage
L inductive load
R resistive load
$R_1$ first shunt resistor
$R_2$ second shunt resistor
T temperature
$T_V$ duty cycle
$T_{V,i}$, i=1, 2 . . . n duty cycle
$t_{PWM}$ period
$t_{on}$ ON length, pulse duration
$t_{off}$ OFF time length, open time length
τ time constant
$i_S$ summation current
$i_A$ actuator current
$i_{A,max}$ maximum value of the actuator current
$i_D$ diode current
$I_S$ average summation current
$I_A$ average actuator current
$I_D$ average diode current
$I_S(T_{V,i})$, i=1, 2 . . . n measured value of average summation current, sample point
$I_A(T_{V,i})$, i=1, 2 . . . n measured value of average actuator current, sample point
Z digital value
u voltage, voltage drop across the shunt resistor
$u_{LP}$ smoothed output voltage
$u_{v,LP}$ smoothed and amplified output voltage $u_{\frac{f_A}{2}, v, LP}$ voltage

The invention claimed is:

1. A method for checking a plausibility of a measurement of an actuator current through a two-terminal actuator, the two-terminal actuator having an inductive load L and a resistive load R, wherein a first terminal of the two-terminal actuator is connected to a supply voltage via a pulse width modulated switch, and to ground via a freewheeling diode, which is disposed in reverse bias, wherein a second terminal of the two-terminal actuator is connected to said ground, which comprises the steps of:
    obtaining measured values including summation current measured values for an average summation current through the pulse width modulated switch, and actuator current measured values for an average actuator current through the second terminal for at least three different duty cycles of a pulse width modulation of the pulse width modulated switch, in a steady state;
    approximating a dependency of the average summation current on a duty cycle by a summation current polynomial $\hat{I}_S(T_V; T_{V,1}, T_{V,2}, \ldots T_{V,N})$ having polynomial coefficients $\alpha_{S,0}, \alpha_{S,1}, \ldots \alpha_{S,N-1}$ that is fitted to at least three of the summation current measured values;
    approximating a dependency of the average actuator current on the duty cycle by an actuator current polynomial $\hat{I}_A(T_V; T_{V,1}, T_{V,2}, \ldots T_{V,N})$ having polynomial coefficients $\alpha_{A,0}, \alpha_{A,1}, \ldots \alpha_{A,N-1}$ that is fitted to at least three of the actuator current measured values;
    calculating an absolute difference between the actuator current polynomial $\hat{I}_A(T_V; T_{V,1}, T_{V,2}, \ldots T_{V,N})$ and the summation current polynomial $\hat{I}_S(T_V; T_{V,1}, T_{V,2}, \ldots T_{V,N})$ for the duty cycle of one ($T_V=1$) and for the duty cycle of zero ($T_V=0$);
    comparing the absolute difference with predetermined corresponding tolerances; and
    determining the measurement of the actuator current to be implausible when at least one of the predetermined corresponding tolerances is exceeded.

2. The method according to claim 1, which further comprises selecting the actuator current polynomial $\hat{I}_A(T_V; T_{V,1}, T_{V,2}, \ldots T_{V,N})$ and the summation current polynomial $\hat{I}_S(T_V; T_{V,1}, T_{V,2}, \ldots T_{V,N})$ to be Newton interpolation polynomials, which each pass through a respective one of the measured values and, and wherein the actuator current polynomial $\hat{I}_A(T_V; T_{V,1}, T_{V,2}, \ldots T_{V,N})$ and the summation polynomial coefficients $\alpha_{S,0}, \alpha_{S,1}, \ldots \alpha_{S,N-1} \alpha_{A,0}, \alpha_{A,1}, \ldots \alpha_{A,N-1}$ are obtained in accordance with a method of divided differences.

3. The method according to claim 1, which further comprises detecting the actuator current measured values and the summation current measured values at defined duty cycles.

4. The method according to claim 1, which further comprises detecting three said actuator current measured values and three said summation current measured values.

5. The method according to claim 1, which further comprises:
    comparing a magnitude of a second-order polynomial coefficient $\alpha_{A,2}$ of the actuator current polynomial $\hat{I}_A(T_V; T_{V,1}, T_{V,2}, \ldots T_{V,N})$ with a predetermined limit value; and
    determining a measurement of the actuator current is implausible when the magnitude of the second-order polynomial coefficient $\alpha_{A,2}$ exceeds the predetermined limit value.

6. The method according to claim 1, wherein the two-terminal actuator is part of a solenoid poppet valve.

7. The method according to claim 1, wherein the two-terminal actuator is part of an electromagnetic fast-switching valve.

8. The method according to claim 1, wherein the two-terminal actuator is part of an electromagnetic gear-selector valve.

9. The method according to claim 1, wherein the two-terminal actuator is part of an electromagnetic proportional valve.

10. The method according to claim 1, wherein the two-terminal actuator is part of an electromagnetic on/off valve.

11. The method according to claim 1, wherein the two-terminal actuator is part of an electromagnetic injector.

12. The method according to claim 1, which further comprises selecting a period of the pulse width modulation of the pulse width modulated switch to be less than a time constant $\tau$ or greater than 50 times the time constant, wherein the time constant $\tau=L/R$ is defined as a ratio of the inductive load L and the resistive load R between the supply voltage and the ground when the pulse width modulated switch of the two-terminal actuator is closed.

13. The method according to claim 12, which further comprises selecting the period of the pulse width modulation of the pulse width modulated switch to be less than the time constant or greater than 100 times the time constant.

14. The method according to claim 1, which further comprises:
  providing shunt resistors, including:
    a first shunt resistor disposed between the pulse width modulated switch and the supply voltage;
    a second shunt resistor disposed between the second terminal and said ground, and in that the average summation current is obtained by measuring a voltage across the first shunt resistor when the pulse width modulated switch is on for its ON duration, and the average actuator current is obtained by measuring a voltage across the second shunt resistor in an entire period.

15. The method according to claim 14, wherein a digital value or an average current is obtained by evaluating the voltage across one of the shunt resistors by means of one of two measurement paths, in which process the voltage across the one shunt resistor is smoothed by a smoothing low-pass filter, then amplified by an amplifier, then frequency-limited or averaged by a filter, then sampled and discretized by an analog-to-digital converter, and the average current is determined from a discretized value according to a predetermined voltage/current characteristic.

16. The method according to claim 15, wherein a predetermined voltage/current characteristic is a linear function having a gradient and an offset, each of which is predetermined according to a temperature.

17. The method according to claim 15, wherein overall gains of both said measurement paths are each determined from a difference between two values of an associated current polynomial $$\hat{I}_S(T_V=1;T_{V,1},T_{V,2},\ldots T_{V,N}) - \hat{I}_S(T_V=0;T_{V,1},T_{V,2},\ldots T_{V,N})$$

$$\hat{I}_A(T_V=1;T_{V,1},T_{V,2},\ldots T_{V,N}) - \hat{I}_A(T_V=0;T_{V,1},T_{V,2},\ldots T_{V,N})$$

for the duty cycle of one ($T_V=1$) and for the duty cycle of zero ($T_V=0$), wherein a ratio of, or an absolute or relative difference between, the two overall gains is formed, and is subject to a value-range check, and a measurement of the current-value of the actuator current is identified as implausible when a ratio of, or an absolute or relative difference between, the two overall gains exceeds a predetermined value range.

18. The method according to claim 15, wherein a value of a current polynomial $$\hat{I}_S(T_V=0;T_{V,1},T_{V,2},\ldots T_{V,N}), \hat{I}_A(T_V=0;T_{V,1},T_{V,2},\ldots T_{V,N})$$

is determined for a duty cycle of zero ($T_V=0$) and compared with a predetermined amplifier offset value, wherein a measurement of a current-value of the actuator current is determined to be implausible when the value of the current polynomial $\hat{I}_S(T_V=0; T_{V,1}, T_{V,2}, \ldots T_{V,N})$, $\hat{I}_A(T_V=0; T_{V,1}, T_{V,2}, \ldots T_{V,N})$ differs from a predetermined amplifier offset value by a predetermined limit value.

19. The method according to claim 15, wherein the filter is an anti-aliasing low-pass filter/averaging low-pass filter.

* * * * *